United States Patent [19]
Nishimura

[11] Patent Number: 5,168,340
[45] Date of Patent: Dec. 1, 1992

[54] SEMICONDUCTOR INTEGRATED CIRCUIT DEVICE WITH GUARDRING REGIONS TO PREVENT THE FORMATION OF AN MOS DIODE

[75] Inventor: Akitoshi Nishimura, Ibaraki, Japan

[73] Assignee: Texas Instruments Incorporated, Dallas, Tex.

[21] Appl. No.: 596,614

[22] Filed: Oct. 12, 1990

Related U.S. Application Data

[63] Continuation of Ser. No. 393,425, Aug. 14, 1989, abandoned.

[30] Foreign Application Priority Data

Aug. 17, 1988 [JP] Japan .................................. 63-204411

[51] Int. Cl.[5] .......................................... H01L 27/02
[52] U.S. Cl. .................................. 257/376; 257/409; 257/519; 257/547; 257/632
[58] Field of Search .................. 357/42, 50, 52, 52 D, 357/48

[56] References Cited

U.S. PATENT DOCUMENTS

| | | | |
|---|---|---|---|
| 4,063,274 | 12/1977 | Dingwall | 357/42 |
| 4,240,093 | 12/1980 | Dingwall | 357/42 |
| 4,273,805 | 6/1981 | Dawson et al. | 357/42 |
| 4,295,897 | 10/1981 | Tubbs et al. | 357/42 |
| 4,443,811 | 4/1984 | Tubbs et al. | 357/42 |
| 4,490,736 | 12/1984 | McElroy | 357/42 |
| 4,657,602 | 4/1987 | Henderson, Sr. | 357/42 |
| 4,668,973 | 5/1987 | Dawson et al. | 357/42 |

*Primary Examiner*—William Mintel
*Assistant Examiner*—Steven Loke
*Attorney, Agent, or Firm*—William E. Hiller; Richard L. Donaldson

[57] ABSTRACT

This invention relates to a semiconductor integrated circuit device wherein guardring regions are formed between a first element region and a second element region so as to surround the first element region, wherein gate electrodes are provided to cross the guardring regions, wherein the guardring regions are continuously formed even directly below the gate electrodes, and wherein an insulator film directly below the gate electrodes is relatively thick.

6 Claims, 5 Drawing Sheets

| | COMPARISON 1 NOT APPLYING $V_{cc}$ TO CONTACT 12a | COMPARISON 2 APPLYING $V_{cc}$ TO CONTACT 12a | EMBODIMENT (FIG. 1) APPLYING $V_{cc}$ TO CONTACT 12 |
|---|---|---|---|
| HOLDING VOLTAGE (V) | 0.8 | 1.6 | 1.7 |
| INJECTION CURRENT (mA) | 0.09 | 12 | 15 |

SEMICONDUCTOR INTEGRATED CIRCUIT DEVICE WITH GUARDRING REGIONS TO PREVENT THE FORMATION OF AN MOS DIODE

This application is a continuation of application Ser. No. 07/393,425, filed Aug. 14, 1989, now abandoned.

BACKGROUND OF THE INVENTION

1. Field of the Invention

This invention relates to a semiconductor integrated circuit device, for example, to a CMOS (Complementary Metal Oxide Semiconductor).

2. Brief Description of the Prior Art

Conventionally, in well known semiconductor integrated circuit devices, for example, ones having a CMOS structure, latchup, which is characteristic of such CMOS device, occurs easily. That is, in adjacent elements (e.g., P channel and N channel MOS transistors), a PNPN or NPNP structured parasitic thyristor occurs and acts to induce malfunction by trigger action of some external factor.

To prevent such latchup, diffusion layers, referred to in general as guardrings, are provided in predetermined areas.

With regard to FIGS. 7 and 8 there is shown an N type well 2 in a P type silicon substrate 1, with P channel MOS transistors 20a and 20b having a source region (a P+ type diffusion region) 9 and drain regions (P+ type diffusion regions) 10, both provided in this N type well 2, (the two drain regions 10 being provided here with the common source region 9).

On the other hand, N channel MOS transistors 20c and 20d include a source region (an N+ type diffusion region) 4 and drain regions (P+ type diffusion regions) 5, both provided in the P type silicon substrate 1, (the two drain regions 5 being provided with the common source region 4). Furthermore, as seen in FIG. 7, a CMOS device (e.g., an inverter circuit) comprises two gate electrodes 7 commonly provided to the P channel MOS transistors 20a and 20b and to the N channel MOS transistors 20c and 20d respectively.

A guardring region (an N+ type diffusion region) 8 is formed in a predetermined area so as to surround the P channel MOS transistors 20a and 20b. However, as seen in FIG. 7, this guardring region 8 is not provided in the area where the gate electrodes 7 cross over the guardring region 8 (i.e., the guardring region 8 is not continuously formed). Referring to reference numerals shown in FIG. 8, 3 is a field oxide film, 6 is a gate oxide film, 8a is an island shaped N+ type diffusion region (a part of the guardring region), 11 is a contact hole, and 12 is an electrode (or contacts) to maintain the guardring region at a supply voltage $V_{cc}$.

According to the above structure, as shown in a chart of FIG. 9, the conventional CMOS type 1M dynamic RAM has a higher resistance to latchup when the voltage is applied to the guardring (comparison 2) than when it is not applied thereto (comparison 1). However, the reliability is still insufficient, and the below noted problems remain.

(1) In the area where the gate electrodes 7 cross over the guardring region 8 (directly below the gate electrodes 7), the guardring region 8 is mutilated and not continuously formed, so there is a possibility that latchup may occur through the area without the guardring.

(2) Because there is the island shaped guardring region 8a as described above (one region in this case), a contact 12a must be defined to separately apply the supply voltage $V_{cc}$ also to this guardring region 8a (a certain area is required to provide this contact). It is difficult to make the contact in such a place with a minimum area so that taking excess area cannot be avoided.

PURPOSE OF THE INVENTION

A purpose of the invention is to provide a highly reliable semiconductor integrated circuit device which has a high resistance to latchup, in which contacts can easily be defined without taking excess area, and which does not form an undesirable parasitic MOS structure.

SUMMARY OF THE INVENTION

This invention relates to such semiconductor integrated circuit device wherein guardring regions are formed between the first element region (e.g., a P channel MOS transistor which will be later described) and the second element region (e.g., an N channel MOS transistor which will be later described) so as to surround said first element region (e.g., the P channel MOS transistor which will be described later), wherein gate electrodes are provided to cross the guardring regions, wherein said guardring regions are continuously formed even directly below the gate electrodes, and wherein an insulator film directly below said gate electrodes is relatively thick.

BRIEF DESCRIPTION OF THE DRAWINGS

FIGS. 1-6 and 9 show embodiments of the invention;

FIG. 1 a plan view of a main part of the CMOS device of a first embodiment;

FIG. 2 is a sectional view of FIG. 1 taken along the line II—II;

FIG. 3 is a sectional view of FIG. 1 taken along the line III—III;

FIG. 5 is a plan view of a main part of the CMOS device of another embodiment;

FIG. 6 is a plan view of a main part of the CMOS device of also another embodiment; and FIG. 9 is a chart showing the resistance to the latchup in comparison.

FIGS. 7 and 8 show prior art;

FIG. 7 is a plan view of a main part of a conventional CMOS device;

FIG. 8 is a sectional view of FIG. 7 taken along the line VIII—VIII.

In reference numerals shown in the figures:

1 ... P type silicon substrate;
2 ... N type well;
3 ... field oxide film;
4, 9 ... N+ type/P+ type source region;
5, 10 ... N+ type/P+ type drain regions;
7 ... gate electrodes;
8, 8a, 13 ... guardring regions;
12 ... contacts (electrodes);
14 ... thick oxide film;
20a, 20b ... P channel MOS transistors (the first element region)
20c, 20d ... N channel MOS transistors (the second element region)

DESCRIPTION OF THE PREFERRED EMBODIMENTS

Hereinafter, the embodiments of the invention will be described.

FIGS. 1-4 show a first embodiment of this invention.

Figure 1:
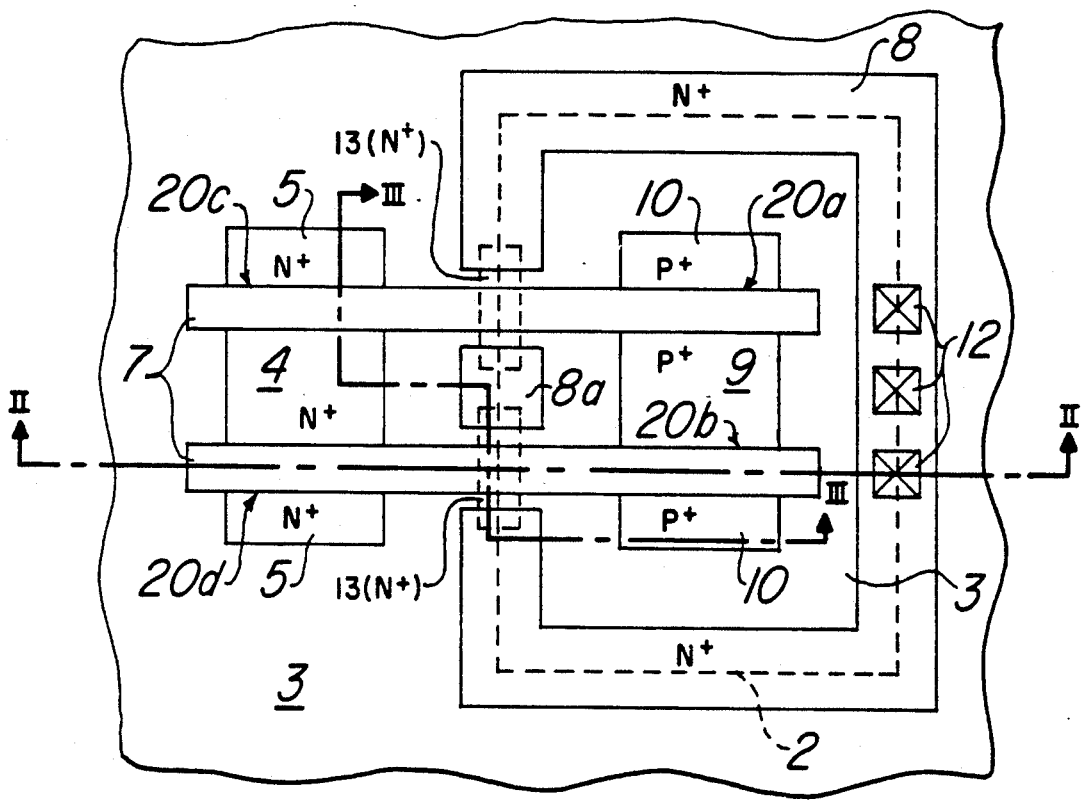

The structure of the CMOS device according to the embodiment is significantly different from that of the prior art in that guardring regions are provided, even directly below gate electrodes 7 crossing a guardring region 8, as seen in FIG. 1. That is, N+ type buried diffusion layers (parts of the guardring region) 13 are respectively provided directly below the two gate electrodes 7 so that the guardring region 8 and an island shaped guardring region 8a are connected to each other (see FIG. 3), and that the guardring regions (8, 8a, and 13 in Figures) are continuously provided to entirely surround P channel MOS transistors 20a and 20b. Reference numeral 14 in the figures indicates a relatively thick oxide film formed on the regions 13 and performs an important action as will be later described.

According to the CMOS device of the invention, as described above, because the guardring regions (8, 8a, and 13) are continuously provided to entirely surround the P channel MOS transistors 20a and 20b, significant action/effect can be achieved as shown below.

Figures 8, 9:
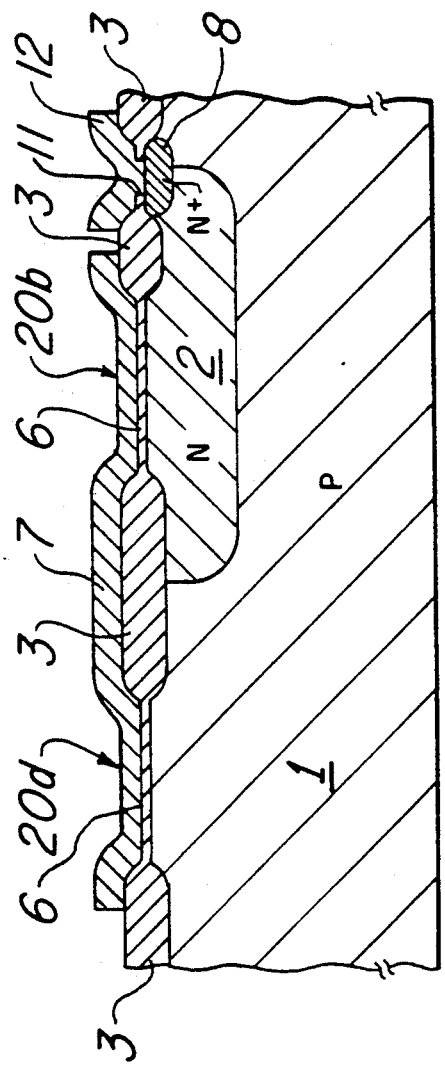

(1) As shown in FIG. 9, the actual CMOS type 1M dynamic RAM shows high resistance to latchup and may almost entirely prevent latchup (which would cause the CMOS circuit to mulfunction and which would destroy the chip itself by heat).

(2) Because there is no need to define a contact for applying the voltage $V_{cc}$ in the above guardring region 8a (between the two gate electrodes 7) and contacts 12 can be provided in other appropriate areas (especially in the places shown in the Figures), the contacts may be easily defined without taking excess area.

(3) Although the buried diffusion layers (guardring regions) 13 are provided directly below the two gate electrodes 7, the formation of an undesirable MOS structure (e.g., a formation of MOS diode by an inversion layer) may be prevented because the thick oxide film 14 (400-8000 Å thick, e.g., about 2000 Å thick) is formed there.

(4) The buried diffusion layers 13 may be easily formed because they require only one additional mask process (see FIG. 4) and can be formed in a common process with DRAM bit lines (not shown).

Next, a fabrication method of the CMOS device according to the embodiment will be described in conjunction with FIG. 4.

Figure 4B:
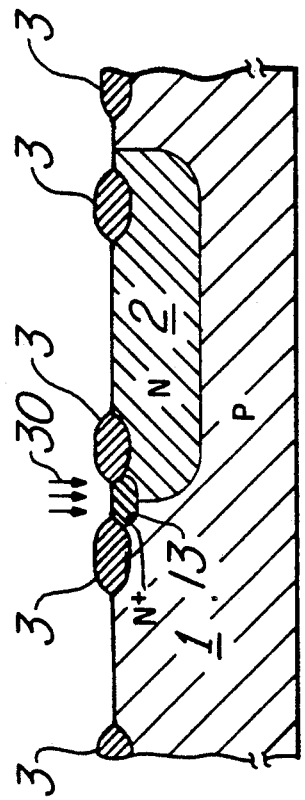
FIGS. 4A, 4B, 4C, 4D, and 4E are sectional views showing, in sequence, main stages of a fabrication method of the CMOS device of FIG. 1.
Figure 4A:
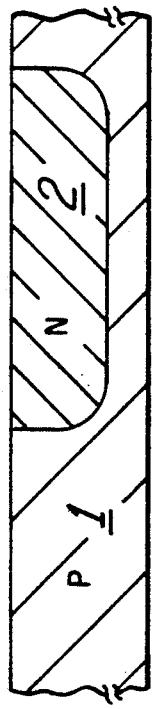

First, as in FIG. 4A, an N well 2 is formed in a predetermined area of a P type silicon substrate 1 by a well known well diffusion process (a surface of the substrate 1 is divided into an N channel MOS region and a P channel MOS region).

Then, as in FIG. 4B, a field oxide film 3 is selectively formed on the surface of the P type silicon substrate 1 by a well known LOCOS (Local Oxidation of Silicon) method, and ions 30 of an N type impurity (e.g., As) are selectively implanted in high concentration by an ion implantation method to from the N+ type regions (buried diffusion layers) 13. Although not shown in the figures, in a memory part of the DRAM, the bit lines consisting of the N+ type buried diffusion layers similar to the above are simultaneously formed.

Figure 4C:
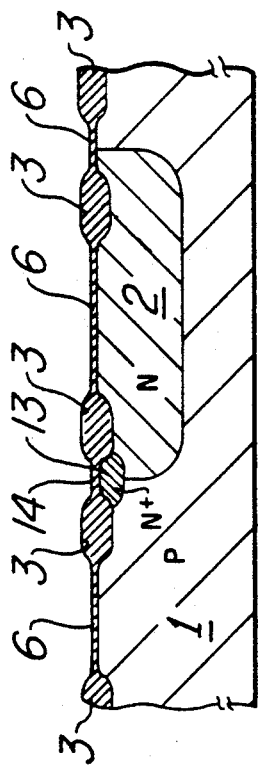

Next, as in FIG. 4C, a gate oxide film 6 is formed on the surface by a thermal oxidation method (at this time, a part of the N+ type regions 13 is further oxidized to form the relatively thick oxide film 14).

Figure 4D:
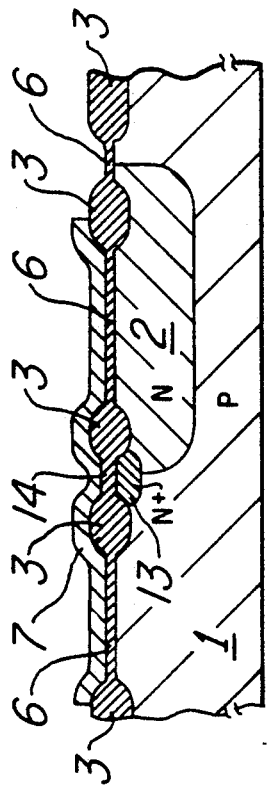

Next, as in FIG. 4D, polysilicon is deposited by a CVD (Chemical Vapor Deposition) process and patterned to form the gate electrodes 7.

Figure 4E:
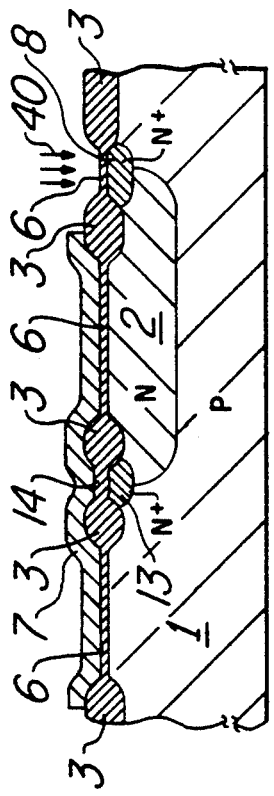

Next, as in FIG. 4E, ions 40 of an N type impurity (e.g., As) are selectively implanted in high concentration by an ion implantation method to form the N+ type region (guardring region) 8. Although not shown, at the time of this ion implantation, the PMOS region being covered with a mask (e.g., photoresist) and the gate electrodes 7 and the field oxide film 3 being used as a mask, a source region 4 and drain regions 5 are respectively formed in the N channel MOS region simultaneously with guardring 8.

Figure 2:
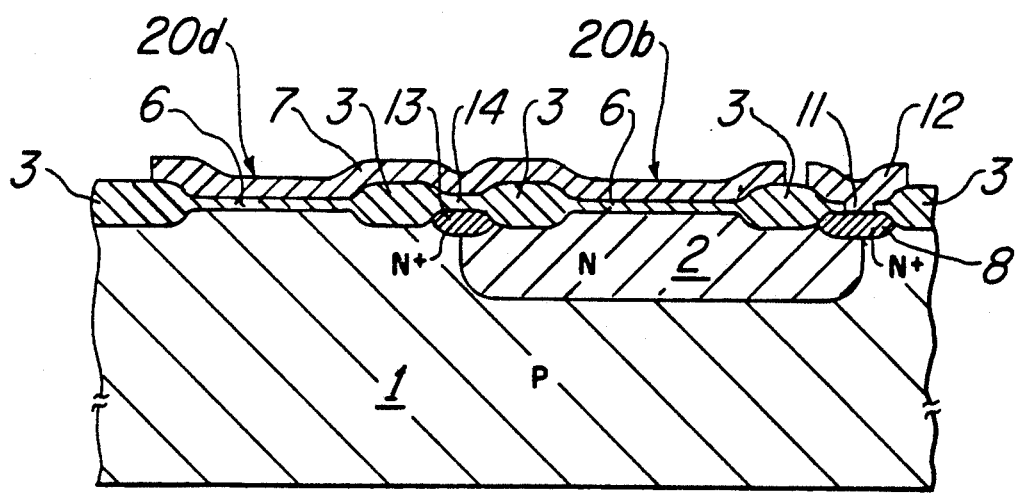
Figure 3:
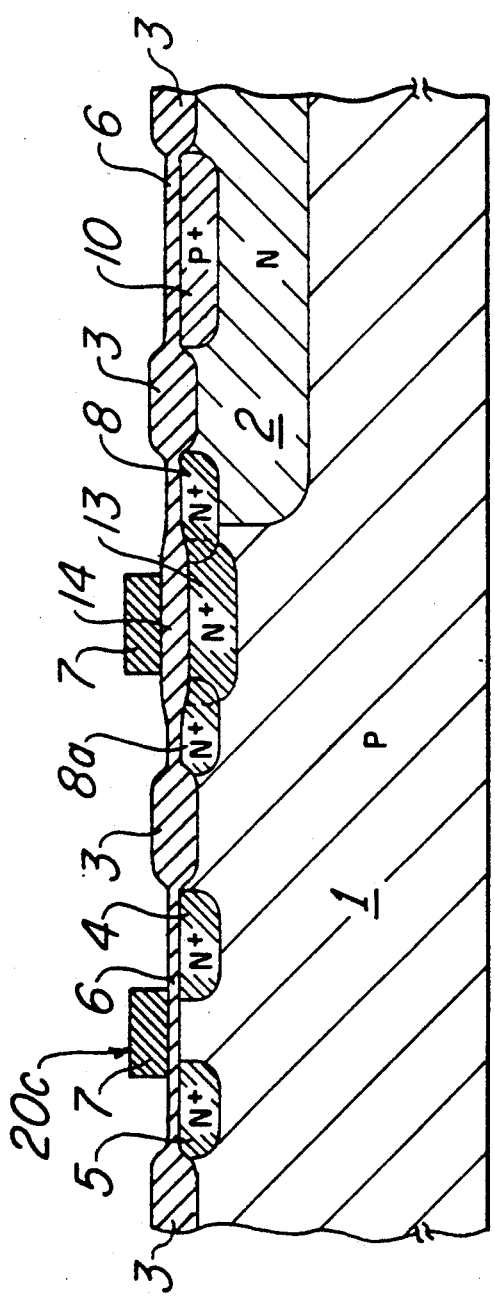

Also, although not shown, the N channel MOS region being covered with a mask and the gate electrodes 7 and the field oxide film 3 being used as a mask, ions of a P type impurity (e.g., boron) are implanted by an ion implantation method to respectively form a source region 9 and drain regions 10 in the P channel MOS region. Furthermore, by forming contact holes and providing each wiring, the device shown in FIGS. 1-3 is completed.

As evident from the above fabrication method according to the CMOS device of the embodiment, the continuous guardring regions may be provided, even directly below the gate electrodes, using the same diffusion layers as the buried diffusion layers used in the bit lines of the actual 1M dynamic RAM. Especially in this kind of semiconductor integrated circuit device, it is a significant means to form the guardring regions using the buried diffusion layers.

Also, the above buried diffusion layers may easily fabricate the desired device without any significant changes in the process (e.g., only by adding one mask process).

Figure 5:
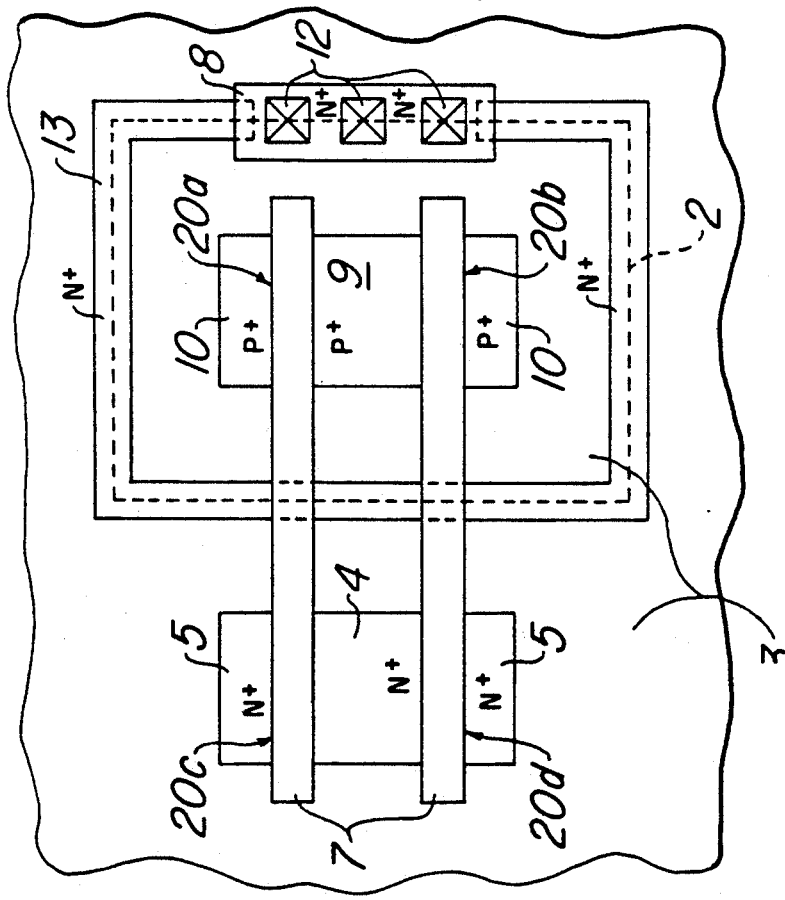

FIG. 5 shows another embodiment of the invention.

In this embodiment, the majority part of the guardring region, except the one taking the contacts 12, is formed by the above N+ type buried diffusion layer.

In the CMOS device of this embodiment, the same action/effect as in the first embodiment can be achieved, and the area of this kind of device may be reduced because the diffusion layer 13 can be formed relatively narrowly to reduce the area of the guardring region as a whole.

Figure 6:
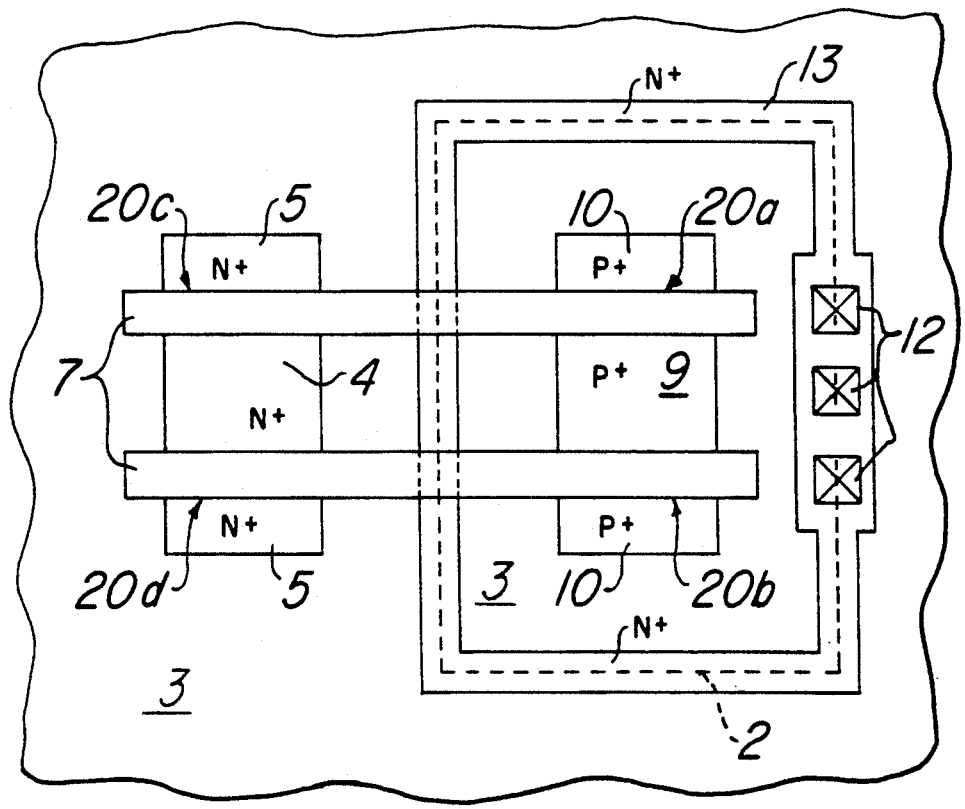
Figure 7:
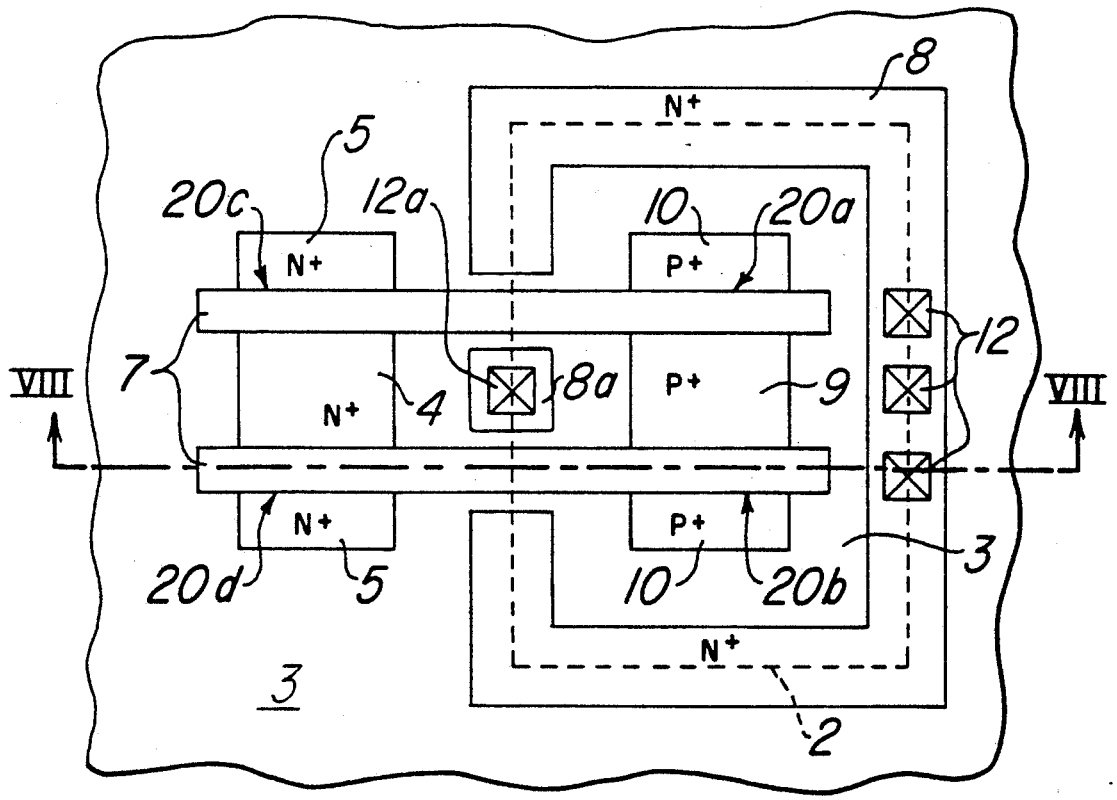

FIG. 6 shows also another embodiment of the invention.

This is an embodiment wherein the guardring region is all formed of the N+ buried diffusion layer 13, which is advantageous in the fabrication method in that the guardring can be formed with only one mask; in addition to that, there are the same advantages as in the embodiment in FIG. 5.

Referring to the chart of FIG. 9, the designation "holding voltage" refers to the minimum service voltage in which latchup may occur, and the designation "injection current" refers to the magnitude of injection current which can lead to latchup. The embodiment of the invention illustrated in FIG. 1, for example, as demonstrated by the chart of FIG. 9 exhibits high resistance to latchup.

Although the invention has been illustrated in the above, the above embodiments may be further modified based on the idea of the invention.

For example, the shapes and locations of the guardring regions may be appropriately changed, and the invention may also be applied to a bi-MOS and the like (i.e., a case in which an NPN type bipolar transistor is provided in the above PMOS region). The number of gate electrodes may be one or three, or even more. The locations of the contacts for the guardring regions may be appropriately changed.

Although polysilicon is used for the gate electrodes in the above embodiment, aluminum and the like may also be used; other materials, such as metals which have high melting points, for example, titanium, tungsten, tantalum and the like, and silicide, which is a compound of metal and Si, may be used; and the materials of the contact electrode and the number of the contacts may be appropriately selected.

Although the 1M dynamic RAM has been illustrated in the above embodiments, the invention is not limited thereto and may be applied to CMOS and the like for a static RAM, for example. Moreover, the invention can be applied to a device in which a thin epitaxial layer is formed on a substrate of high concentration (an epitaxial wafer), in which the substrate resistance may be greatly reduced and the resistance to latchup may be greatly improved.

Also, the conductivity types of the above respective semiconductor regions may be reversed, and the shapes and locations of each region and the like may also be changed.

ACTION/EFFECT OF THE INVENTION

Because the guardring regions are continuously provided even directly below the gate electrodes in this invention as described above, a carrier injection which causes the latchup can be prevented and the contacts can be easily formed in appropriate locations without taking any excess areas. Also, because the insulator film directly below the above gate electrodes is relatively thick, an undesirable MOS structure is not formed in this area, so a highly reliable semiconductor integrated circuit device can be provided.

What is claimed is:

1. A semiconductor integrated circuit device comprising:
   (a) semiconductor body having therein a first semiconductor element region of a first conductivity type and a second semiconductor element region of a second conductivity type, said second semiconductor element region being spaced from said first semiconductor element region;
   (b) a first discontinuous guardring portion of said second conductivity type having at least one discontinuity and encircling in part said first semiconductor element region;
   (c) a second guardring portion of said second conductivity type at least partially buried in said semiconductor body and coupling together said first guardring portion at said at least one discontinuity to form a continuous guardring with said first guardring portion;
   (d) a first external insulating layer disposed over said first guardring portion;
   (e) a second insulating layer disposed over said second guardring portion providing a thicker insulating region over said second guardring portion than said first external insulating layer provides over said first guardring portion and having a thickness of from about 400 to about 8000 Angstroms sufficient to prevent formation of an MOS diode; and
   (f) an electrically conductive member disposed over said first and second semiconductor regions, said first insulating layer and said second insulating layer and said second guardring portion.

2. A device as set forth in claim 1 wherein said first semiconductor element region includes an active semiconductor device and said second semiconductor element region includes a complementary active semiconductor device, said electrically conductive member being coupled to each of said active semiconductor devices.

3. A device as set forth in claim 2 wherein said electrically conductive member is a gate electrode for each of said active devices.

4. A device as set forth in claim 3 wherein said first semiconductor region is of a first conductivity type and said second semiconductor region is of opposite conductivity type and said active semiconductor devices are MOS transistors.

5. A device as set forth in claim 2 wherein said first semiconductor region is of a first conductivity type and said second semiconductor region is of opposite conductivity type and said active semiconductor devices are MOS transistors.

6. A device as set forth in claim 1 wherein said first semiconductor region is of a first conductivity type and said second semiconductor region is of opposite conductivity type.

* * * * *